(12) United States Patent
Hsu

(10) Patent No.: US 6,344,398 B1
(45) Date of Patent: Feb. 5, 2002

(54) METHOD FOR FORMING TRANSISTOR DEVICES WITH DIFFERENT SPACER WIDTH

(75) Inventor: Shih-Ying Hsu, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/690,514

(22) Filed: Oct. 17, 2000

(51) Int. Cl.[7] .............................. H01L 21/336
(52) U.S. Cl. ................... 438/303; 438/305; 438/587; 438/595
(58) Field of Search ................... 438/303, 305, 438/306, 587, 595

(56) References Cited

U.S. PATENT DOCUMENTS

| | | | |
|---|---|---|---|
| 5,021,354 A | * 6/1991 | Pfiester | |
| 5,552,331 A | * 9/1996 | Hsu et al. | |
| 5,882,973 A | * 3/1999 | Gardner et al. | 438/303 |
| 6,046,089 A | * 4/2000 | Gardner et al. | 438/303 |
| 6,103,611 A | * 8/2000 | En et al. | 438/595 |
| 6,248,623 B1 | * 6/2001 | Chien et al. | 438/303 |

* cited by examiner

Primary Examiner—Trung Dang

(57) ABSTRACT

A method for forming transistor devices with different spacer width for mixed-mode IC is provided. The method provides three different kinds of transistor devices on a wafer, two of them have their own spacer with different width, while the remaining one is without a spacer. The method comprises providing a semiconductor substrate having at least a first conductive gate, a second conductive gate and a third conductive gate formed thereon, and forming a first oxide layer over the first conductive gate, the second conductive gate and the third conductive gate. Then, a first etch operation is performed to form an oxide spacer along each sidewall of the first conductive gate, the second conductive gate and the third conductive gate. A first mask is then formed over the first conductive gate, and then the spacer is removed formed along each sidewall of the second conductive gate and the third conductive gate. After that, the first mask over the first conductive gate is removed. Subsequently, a silicon nitride layer is formed with a thickness different from that of the first oxide layer over the first conductive gate, the second conductive gate and the third conductive gate. Then, a second etch operation is performed to form a spacer of silicon nitride along each sidewall of the second conductive gate and the third conductive gate. Thereafter, a second conformal oxide layer is formed over the first conductive gate, the second conductive gate and the third conductive gate. Subsequently, a second mask is formed over the second oxide layer formed on the second conductive gate, while exposing the second conformal oxide layer over the first conductive gate and the third conductive gate. The second oxide layer is removed, and then the second mask is removed. Finally, the spacer of silicon nitride is removed along each sidewall of the third conductive gate with hot $H_3PO_4$ aqueous solution.

30 Claims, 3 Drawing Sheets

METHOD FOR FORMING TRANSISTOR DEVICES WITH DIFFERENT SPACER WIDTH

BACKGROUND OF THE INVENTION

1. Field of the Invention

The present invention relates to a method for forming different transistor devices for mixed-mode IC, and more particularly to a method for forming transistor devices with different spacer width for mixed-mode IC.

2. Description of the Prior Art

The conventional mixed-mode IC includes embedded dynamic random access memory (embedded DRAM), embedded static random access memory (embedded SRAM) and application specific integrated circuit (ASIC). In a mixed-mode IC, there are at least two types of transistor devices, for example, memory devices and logic devices. However, different transistor devices are supplied with different operational voltages of $V_{DD}$. The higher the operational voltage $V_{DD}$ is, the higher the driving current $I_{dsat}$ between the source and the drain terminal. In the mixed-mode IC, each transistor device has its own spacer structure whose width varies according to the design rule. The spacer is a means to provide a suitable resistance for the transistor channel. As shown in FIG. 1, if the width L of the spacer 1 is too short, the electric field of the lightly doped drain (LDD) region 2 is significantly increased, and thus the hot carrier effect or other short channel problem is made more severe, even through the driving current $I_{dsat}$ is also increased. Therefore, this leads to the failure of device reliability. However, if the spacer width is too long, the hot carrier effect is eliminated, while the driving current between the source and the drain terminal will be too low. Hence, there is a trade-off between the high operational voltage $V_{DD}$ and the length of the spacer for transistor devices in the mixed-mode IC.

The main defect in the conventional method of spacer formation is that there is no systematic process for simultaneously forming spacers with different widths to satisfy the demands of the different types of transistor devices in the mixed-mode IC. Accordingly, there exists a desire to provide an improved method for simultaneously forming spacers with different width.

SUMMARY OF THE INVENTION

It is one object of the present invention to provide a method for forming transistor devices with different spacer widths for mixed-mode IC, in which at least three kinds of different transistor devices are formed on a wafer. Two of them have their own spacer with different widths, and the remaining one is without a spacer.

It is another object of the present invention to provide a method for forming transistor devices with different spacer width for mixed-mode IC, which utilizes a two-step etching process.

In order to achieve the above objects, the present invention provides a method for forming transistor devices with different spacer width for mixed-mode IC. Firstly, a semiconductor substrate is provided with at least a first conductive gate, a second conductive gate and a third conductive gate formed thereon. A lightly doped drain (LDD) region is formed under each side of the first conductive gate and the second conductive gate in the substrate. Then, a first oxide layer is formed over the first conductive gate, the second conductive gate and the third conductive gate, and a first etch operation is performed to form an oxide spacer along each sidewall of the first conductive gate, the second conductive gate and the third conductive gate. Thereafter, a first mask is formed over the first conductive gate, while exposing the second conductive gate and said third conductive gate. Subsequently, the oxide spacer is removed along each sidewall of the second conductive gate and the third conductive gate, and then the first mask is removed over the first conductive gate. Afterwards, a silicon nitride layer is formed over the first conductive gate with the oxide spacer formed along each sidewall thereof, the second conductive gate and the third conductive gate, wherein the thickness of the silicon nitride layer is different from that of the first oxide layer. Then, a second etch operation is performed to form a spacer of silicon nitride along each sidewall of the second conductive gate and the third conductive gate. After that, a second conformal oxide layer is formed over the first conductive gate, the second conductive gate and the third conductive gate. Then, a second mask is formed over the second conformal oxide layer formed on the second conductive gate, while exposing the second conformal oxide layer over the first conductive gate and the third conductive gate. Subsequently, the second conformal oxide layer is removed over the first conductive gate and the third conductive gate, and then the second mask is removed over the second conformal oxide layer formed on the second conductive gate. Thereafter, the spacer of silicon nitride formed along each sidewall of the third conductive gate is removed. Finally, a source/drain region is formed in the substrate beside each of the lightly doped drain regions and each side of the third conductive gate.

BRIEF DESCRIPTION OF THE DRAWINGS

The present invention can be best understood through the following description and accompanying drawings wherein.

DESCRIPTION OF THE PREFERRED EMBODIMENT

The preferred embodiment of the present invention will be explained with reference to the drawings of FIG. 2 to FIG. 5.

Figure 1:
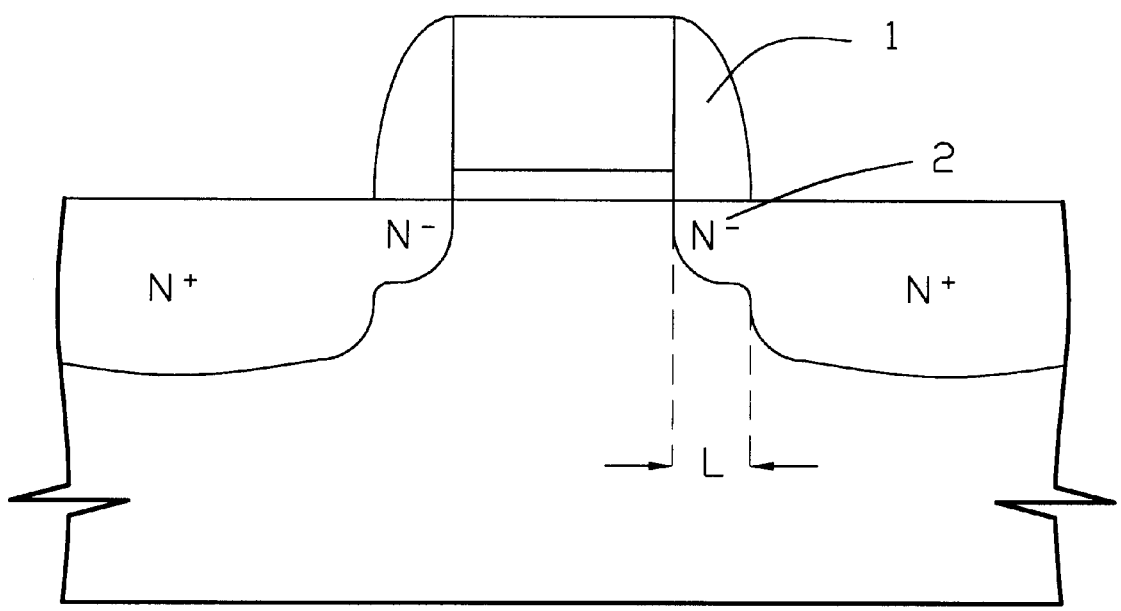
FIG. 1 shows a cross-sectional view of a conventional MOS transistor device formed on a semiconductor substrate.
Figure 2:
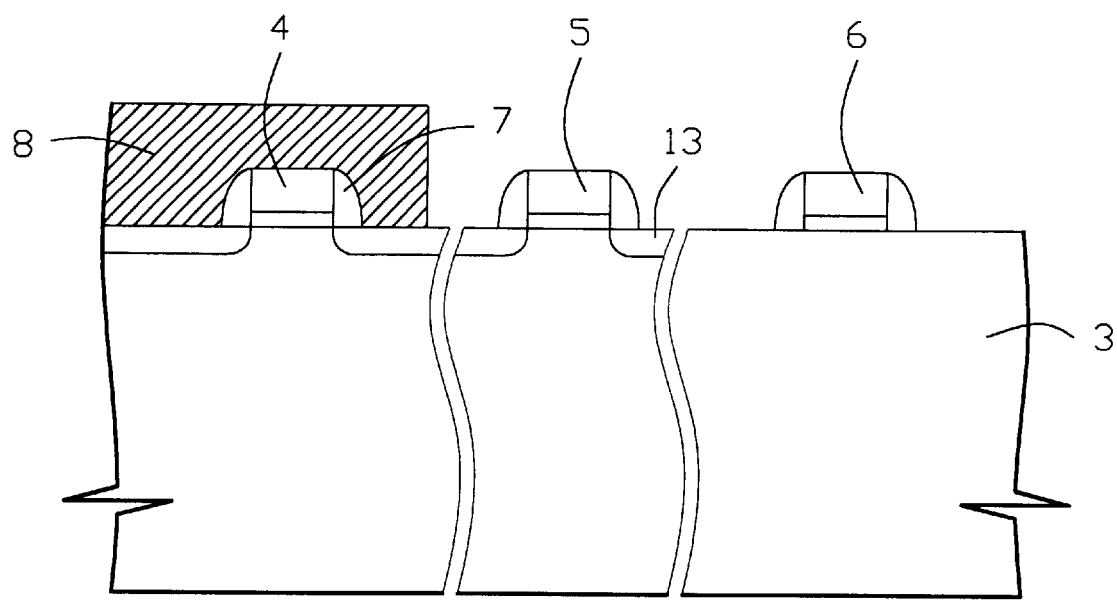
FIG. 2 to FIG. 5 show cross-sectional views of various steps for forming transistor devices with different spacer width on a semiconductor substrate of the present invention.

Referring to FIG. 2, firstly, a semiconductor substrate 3 with at least a first conductive gate 4, a second conductive gate 5 and a third conductive gate 6 formed thereon, is provided. Each of the first conductive gate 4, the second conductive gate 5 and the third conductive gate 6 can be formed of polysilicon. Then, a lightly doped drain (LDD) region is formed under each side of the first conductive gate 4 and the second conductive gate 5 in the substrate 3. Subsequently, a first oxide layer with a thickness of about 1000~1500 angstroms is formed over the first conductive gate 4, the second conductive gate 5 and the third conductive gate 6. The first oxide layer can be a silicon dioxide layer formed by atmospheric pressure CVD method, utilizing $SiH_4$ as the reaction gas at an operation pressure of 0.5~1 torr and at a temperature of 400~500° C. Besides, the first oxide layer can be formed by low pressure CVD method, utilizing TEOS as the reaction gas at an operation pressure of 0.1~5 torr and at a temperature of 650~850° C. The first oxide layer also can be formed by any conventional CVD method. After that, a first etching operation is performed, for example, a reactive ion etching method with reaction gas of $CF_4$ and $O_2$, to form an oxide spacer 7 along each sidewall of the first conductive gate 4, the second conductive gate 5 and the third conductive gate 6. Then, a first mask 8, such as a photoresist, is formed over the first conductive gate 4, while exposing the second conductive gate 5 and the third conductive gate 6. Subsequently, the oxide spacer 7 along each sidewall of the second conductive gate 5 and the third conductive gate 6, by way of, for example, dip etching, utilizing hydrofluoric acid (HF) aqueous solution with concentration of 49 wt. %. The buffered oxide etches is comprised of $NH_4F$ solution, HF solution and water also can serve as the etch solution for the dip etching. The buffered oxide etches can be, for example, a mixture of $NH_4F$ solution, HF solution and water with mixture ratios of four parts of $NH_4F$ solution with concentration of 28.5~40 wt. %, one part of HF solution with concentration of 7.0~8.4 wt. % and five parts of water, or with mixture ratios of seven parts of $NH_4F$ solution with concentration of 33~35 wt. %, one part of HF solution with concentration of 6~9 wt. % and two parts of water.

Figure 3:
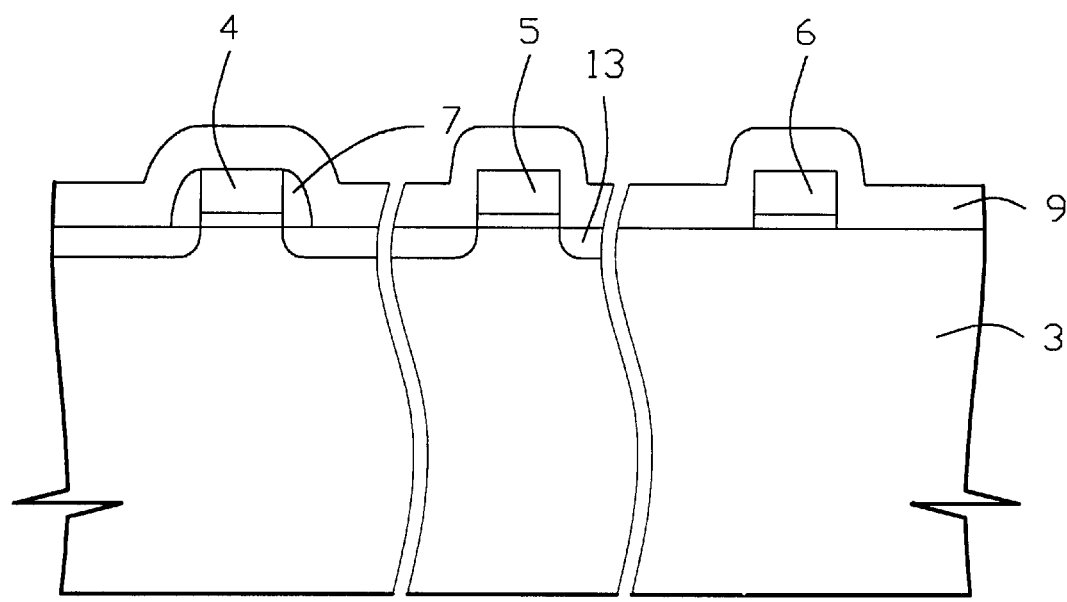
Figure 4:
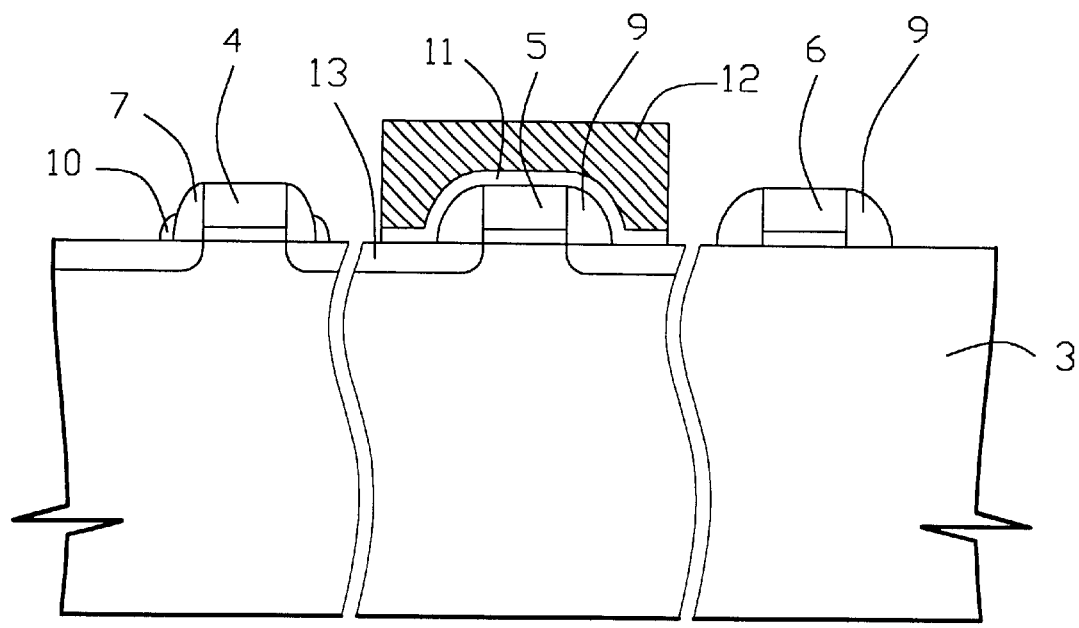
Figure 5:
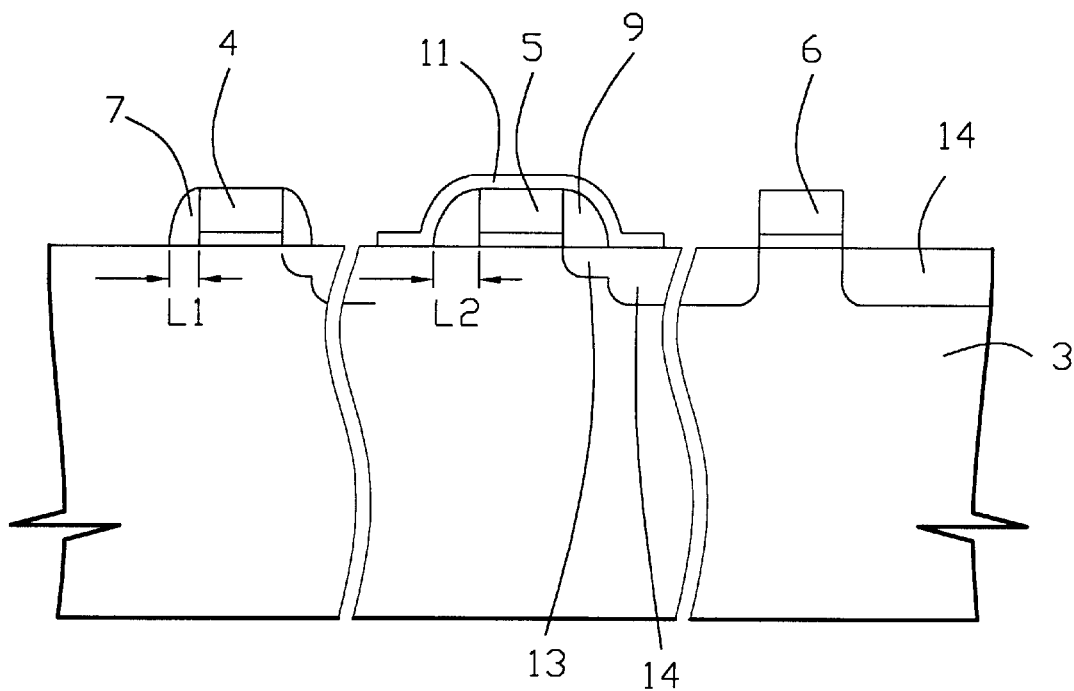

Subsequently, and referring to FIG. 3, a silicon nitride layer 9 with a thickness about 1500~2000 angstroms is formed over the first conductive gate 4, the second conductive gate 5 and the third conductive gate 6. The silicon nitride layer 9 can be formed, for example, by way of plasma enhanced CVD method, utilizing mixture of $SiH_4$, $NH_3$ and $N_2$ as reaction gas. Referring to FIG. 4, thereafter, a second etching operation is performed, for example, either using a reactive ion etching method and high density plasma etching method, utilizing reaction gas of $CF_4$ and $H_2$, to form a spacer 9 of silicon nitride along each sidewall of the second conductive gate 5 and the third conductive gate 6, and a smaller spacer 10 of silicon nitride beside each spacer 7 of the first conductive gate 4. The deposition thickness of the silicon nitride layer 9 is larger than that of the first oxide layer. Therefore, the width $L_2$ of the spacer 9 will be larger than the width $L_1$ of the spacer 7, as shown in FIG. 5. However, the desired spacer width also can be obtained by way of controlling the etching recipe contents of the first and second etching operations. For example, the desired spacer width can be obtained by varying the radio frequency power supplied, the length of over-etching time, the gas flow rate of reactants, or the chamber pressure in the reaction chamber during the etching operation. Subsequently, a second conformal oxide layer 11 is formed with a thickness of about 200 angstroms over the first conductive gate 4, the second conductive gate 5 and the third conductive gate 6. The second oxide layer can be a silicon dioxide layer formed by low pressure CVD method, utilizing TEOS as the reaction gas at an operation pressure of 0.1~5 torr and at a temperature of 650~850° C. In addition, the second oxide layer 11 also can be formed by any conventional CVD method. Then, a second mask 12, such as a photoresist, is formed over the second oxide layer 11 formed on the second conductive gate 5, while exposing the second oxide layer 11 over the first conductive gate 4 and the third conductive gate 6. Afterward, the second oxide layer 11 is removed over the first conductive gate 4 and the third conductive gate 6, by way of dry etching or wet etching, such as BOE etching and HF dip etching. Subsequently, the second mask 12 is removed over the second oxide layer 11 formed on the second conductive gate 5.

Referring to FIG. 5, thereafter, the spacer 9 of silicon nitride of the third conductive gate 6 is removed, and the smaller spacer 10 of silicon nitride of the first conductive gate 4, by way of dip etching, utilizing $H_3PO_4$ aqueous solution with concentration of 86 wt. % at 150~180° C. Finally, ion implantation is performed to form a source/drain region 14 beside each lightly dope drain region 13 and under each side of the third conductive gate 6. According to the present method, there are three kinds of different transistor devices with different spacer widths formed on the substrate 3, which can serve as transistor devices for mixed-mode IC.

The preferred embodiment is only used to illustrate the present invention, and is not intended to limit the scope thereof. Many modifications of the preferred embodiment can be made without departing from the spirit of the present invention.

What is claimed is:

1. A method for forming different spacer for different transistor devices on a semiconductor substrate, said method comprising of:

forming at least a first conductive gate, a second conductive gate and a third conductive gate on said substrate;

forming a first oxide layer over said first conductive gate, said second conductive gate and said third conductive gate;

performing a first etch operation to form an oxide spacer along each sidewall of said first conductive gate, said second conductive gate and said third conductive gate;

a first mask over said first conductive gate, while exposing said second conductive gate and said third conductive gate;

removing said oxide spacer along each sidewall of said second conductive gate and said third conductive gate;

removing said first mask over said first conductive gate;

forming a silicon nitride layer over said first conductive gate with said oxide spacer formed along each sidewall thereof, said second conductive gate and said third conductive gate, wherein the thickness of said silicon nitride layer is different from that of said first oxide layer;

performing a second etch operation to form a spacer of silicon nitride along each sidewall of said second conductive gate and said third conductive gate;

forming a second conformal oxide layer over said first conductive gate, said second conductive gate and said third conductive gate;

forming a second mask over said second conformal oxide layer formed on said second conductive gate, while exposing said second conformal oxide layer over said first conductive gate and said third conductive gate;

removing said second conformal oxide layer over said first conductive gate and said third conductive gate;

removing said second mask over said second conformal oxide layer formed on said second conductive gate; and removing said spacer of silicon nitride formed along each sidewall of said third conductive gate.

2. The method of claim 1, wherein said first oxide layer is formed with a thickness of about 1000~1500 angstroms.

3. The method of claim 1, wherein said silicon nitride layer is formed with a thickness of about 1500~2000 angstroms.

4. The method of claim 1, wherein said first oxide layer further comprises silicon dioxide.

5. The method of claim 4, wherein said first etch operation is performed by way of reactive ion etching method, utilizing mixture of $CF_4$ and $O_2$ as reaction gas.

6. The method of claim 1, wherein said second etch operation is performed by way of reactive ion etching method, utilizing mixture of $CF_4$ and $H_2$ as reaction gas.

7. The method of claim 1, wherein said second etch operation is performed by way of high-density plasma (HDP) etching method, utilizing mixture of $CF_4$ and $H_2$ as reaction gas.

8. The method of claim 1, wherein said second conformal oxide layer further comprises silicon dioxide with a thickness of 200 angstroms.

9. The method of claim 8, wherein said second conformal oxide layer is formed by way of low pressure chemical vapor deposition, utilizing TEOS as reaction gas, at operation pressure of 0.1~5 torr and temperature of 650° C.~850° C.

10. The method of claim 8, wherein said second conformal oxide layer is formed by way of plasma enhanced chemical vapor deposition, utilizing $TEOS/O_3$ as reaction gas.

11. The method of claim 1, wherein said oxide spacer formed along each sidewall of said second conductive gate and said third conductive gate is removed by way of dip etching, utilizing hydrofluoric acid (HF) aqueous solution with concentration about 49 wt %.

12. The method of claim 1, wherein said oxide spacer formed along each sidewall of said second conductive gate and said third conductive gate is removed by way of dip etching, utilizing buffered oxide etches (BOE).

13. The method of claim 12, wherein said buffered oxide etches further comprises mixture solution of $NH_4F$ aqueous solution, HF aqueous solution and water.

14. The method of claim 1, wherein said first mask is formed of a photoresist.

15. The method of claim 1, wherein said second mask is formed of a photoresist.

16. The method of claim 1, wherein said second conformal oxide layer over said first conductive gate and said third conductive gate is removed by way of dry etching.

17. The method of claim 1, wherein said second conformal oxide layer over said first conductive gate and said third conductive gate is removed by way of wet dip etching.

18. The method of claim 1, wherein said spacer of silicon nitride formed along each sidewall of said third conductive gate is removed by $H_3PO_4$ aqueous solution with concentration about 86 wt. % at temperature of 150° C.~180° C.

19. A method for forming transistor devices with different spacer width for mixed-mode IC, said method comprising:

providing a semiconductor substrate having at least a first conductive gate, a second conductive gate and a third conductive gate formed thereon;

forming a lightly doped drain region under each side of said first conductive gate and said second conductive gate in said substrate;

forming a first silicon dioxide layer over said first conductive gate, said second conductive gate and said third conductive gate;

performing a first etch operation to form a spacer of silicon dioxide along each sidewall of said first conductive gate, said second conductive gate and said third conductive gate;

forming a first photoresist layer over said first conductive gate, while exposing said second conductive gate and said third conductive gate;

removing said spacer of silicon dioxide along each sidewall of said second conductive gate and said third conductive gate;

removing said first photoresist layer over said first conductive gate;

forming a silicon nitride layer over said first conductive gate with said spacer of silicon dioxide formed along each sidewall thereof, said second conductive gate and said third conductive gate, wherein the thickness of said silicon nitride layer is different from that of said first silicon dioxide layer;

performing a second etch operation to form a spacer of silicon nitride along each sidewall of said second conductive gate and said third conductive gate;

forming a second conformal silicon dioxide layer over said first conductive gate, said second conductive gate and said third conductive gate;

forming a second photoresist layer over said second conformal silicon dioxide layer formed on said second conductive gate, while exposing said second conformal silicon dioxide layer over said first conductive gate and said third conductive gate;

removing said second conformal silicon dioxide layer over said first conductive gate and said third conductive gate;

removing said second photoresist layer over said second conformal oxide layer formed on said second conductive gate;

removing said spacer of silicon nitride formed along each sidewall of said third conductive gate; and forming a source/drain region in said substrate beside each of said lightly doped drain regions and each side of said third conductive gate.

20. The method of claim 19, wherein said first silicon dioxide layer is formed with a thickness about 1000~1500 angstroms.

21. The method of claim 19, wherein said silicon nitride layer is formed with a thickness about 1500~2000 angstroms.

22. The method of claim 19, wherein said first etch operation is performed by way of reactive ion etching method, utilizing mixture of $CF_4$ and $O_2$ as reaction gas.

23. The method of claim 19, wherein said second etch operation is performed by way of reactive ion etching method, utilizing mixture of $CF_4$ and $H_2$ as reaction gas.

24. The method of claim 19, wherein said second etch operation is performed by way of high-density plasma (HDP) etching method, utilizing mixture of $CF_4$ and $H_2$ as reaction gas.

25. The method of claim 19, wherein said second conformal silicon dioxide layer is formed with a thickness about 200 angstroms, by way of low pressure chemical vapor deposition, utilizing TEOS as reaction gas, at operation pressure of 0.1~5 torr and temperature of 650 ° C.~850° C.

26. The method of claim 19, wherein said second conformal silicon dioxide layer is formed with a thickness about 200 angstroms by way of plasma enhanced chemical vapor deposition, utilizing $TEOS/O_3$ as reaction gas.

27. The method of claim 19, wherein said spacer of silicon dioxide formed along each sidewall of said second conductive gate and said third conductive gate is removed by way of dip etching, utilizing hydrofluoric acid aqueous solution with concentration about 49 wt. %.

28. The method of claim 19, wherein said spacer of silicon dioxide formed along each sidewall of said second conductive gate and said third conductive gate is removed by way of dip etching, utilizing buffered oxide etches (BOE).

29. The method of claim 19, wherein said buffered oxide etches further comprises mixture solution of $NH_4F$ aqueous solution, HF aqueous solution and water.

30. The method of claim 19, wherein said spacer of silicon nitride formed along each sidewall of said third conductive gate is removed by $H_3PO_4$ aqueous solution with concentration about 86 wt. % at temperature of 150° C.~180° C.

* * * * *